(12) United States Patent
Sekimoto

(10) Patent No.: US 8,619,882 B2
(45) Date of Patent: Dec. 31, 2013

(54) DATA MODULATION CIRCUIT

(75) Inventor: Uichi Sekimoto, Shinjuku (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1310 days.

(21) Appl. No.: 12/330,279

(22) Filed: Dec. 8, 2008

(65) Prior Publication Data
US 2009/0285328 A1 Nov. 19, 2009

(30) Foreign Application Priority Data

May 15, 2008 (JP) ................................ 2008-128164

(51) Int. Cl.
*H04B 14/06* (2006.01)
(52) U.S. Cl.
USPC ........... 375/247; 341/143; 348/472; 375/241; 375/242; 375/245
(58) Field of Classification Search
None
See application file for complete search history.

(56) References Cited

U.S. PATENT DOCUMENTS

| 6,404,368 | B1 | 6/2002 | Yamaguchi | |
|---|---|---|---|---|
| 6,816,098 | B2 | 11/2004 | Sekimoto | |
| 7,327,296 | B1 * | 2/2008 | Gaboriau et al. | 341/143 |
| 7,348,813 | B1 * | 3/2008 | Nanda et al. | 327/141 |
| 2006/0158359 | A1 * | 7/2006 | Magrath | 341/143 |

FOREIGN PATENT DOCUMENTS

| JP | 2001-94429 A | 4/2001 |
|---|---|---|
| JP | 2004-147074 A | 5/2004 |

* cited by examiner

*Primary Examiner* — Adolf Dsouza
(74) *Attorney, Agent, or Firm* — Arent Fox LLP

(57) ABSTRACT

A data modulation circuit has an adder adding an input signal, and an output signal of a memory device; and an output circuit part discriminating and quantizing the output signal of the adder by a predetermined threshold value. The memory device receives and holds the output signal of the adder and a predetermined signal, and supplies the held signals to the adder as an output signal of the memory device.

8 Claims, 19 Drawing Sheets

FIG. 2A  RELATED ART

| CLOCK | Vin | AZ⁻¹ | A | Y[1:0] | BZ⁻¹ | B |
|---|---|---|---|---|---|---|
| 1 | 100 | 0 | 100 | 10 | 0 | 128 |
| 2 | 100 | 100 | 72 | 10 | 128 | 128 |
| 3 | 100 | 72 | 44 | 01 | 128 | 64 |
| 4 | 100 | 44 | 80 | 10 | 64 | 128 |
| 5 | 100 | 80 | 52 | 01 | 128 | 64 |
| 6 | 100 | 52 | 88 | 10 | 64 | 128 |
| 7 | 100 | 88 | 60 | 01 | 128 | 64 |
| 8 | 100 | 60 | 96 | 10 | 64 | 128 |
| 9 | 100 | 96 | 68 | 10 | 128 | 128 |
| 10 | 100 | 68 | 40 | 01 | 128 | 64 |

$(128 \times 6 + 64 \times 4)/10 = 102.4$

FIG. 2B  RELATED ART

| CLOCK | Vin | AZ⁻¹ | A | Y[1:0] | BZ⁻¹ | B |
|---|---|---|---|---|---|---|
| 1 | 28 | 0 | 28 | 01 | 0 | 64 |
| 2 | 28 | 28 | -8 | 00 | 64 | 0 |
| 3 | 28 | -8 | 20 | 01 | 0 | 64 |
| 4 | 28 | 20 | -16 | 00 | 64 | 0 |
| 5 | 28 | -16 | 12 | 01 | 0 | 64 |
| 6 | 28 | 12 | -24 | 00 | 64 | 0 |
| 7 | 28 | -24 | 4 | 01 | 0 | 64 |
| 8 | 28 | 4 | -32 | 00 | 64 | 0 |
| 9 | 28 | -32 | -4 | 00 | 0 | 0 |
| 10 | 28 | -4 | 24 | 01 | 0 | 64 |

$(64 \times 5)/10 = 32$ $Y[0] = B2[6] \cdot B2[7] + \overline{B2[6]} \cdot \overline{B2[7]}$

FIG.5A

| CLOCK | Vin | B4 | B2 | B3 | Y[1:0] | NO. OF "00" | NO. OF "01" | NO. OF "11" | NO. OF "10" |
|---|---|---|---|---|---|---|---|---|---|
| 1 | 100 | 0 | 100 | -28 | 10 | 0 | 0 | 4 | 6 |
| 2 | 100 | -28 | 72 | -56 | 10 | | | | |
| 3 | 100 | -56 | 44 | -20 | 11 | | | | |
| 4 | 100 | -20 | 80 | -48 | 10 | | | | |
| 5 | 100 | -48 | 52 | -12 | 11 | | | | |
| 6 | 100 | -12 | 88 | -40 | 10 | | | | |
| 7 | 100 | -40 | 60 | -4 | 11 | | | | |
| 8 | 100 | -4 | 96 | -32 | 10 | | | | |
| 9 | 100 | -32 | 68 | -60 | 10 | | | | |
| 10 | 100 | -60 | 40 | -24 | 11 | | | | |

$((-128) \times 0 + (-64) \times 0 + 64 \times 4 + 128 \times 6)/10 = 102.4$

FIG.5B

| CLOCK | Vin | B4 | B2 | B3 | Y[1:0] | NO. OF "00" | NO. OF "01" | NO. OF "11" | NO. OF "10" |
|---|---|---|---|---|---|---|---|---|---|
| 1 | 28 | 0 | 28 | -36 | 11 | 0 | 4 | 3 | 3 |
| 2 | 28 | -36 | -8 | 56 | 01 | | | | |
| 3 | 28 | 56 | 84 | -44 | 10 | | | | |
| 4 | 28 | -44 | -16 | 48 | 01 | | | | |
| 5 | 28 | 48 | 76 | -52 | 10 | | | | |
| 6 | 28 | -52 | -24 | 40 | 01 | | | | |
| 7 | 28 | 40 | 68 | -60 | 10 | | | | |
| 8 | 28 | -60 | -32 | 32 | 01 | | | | |
| 9 | 28 | 32 | 60 | -4 | 11 | | | | |
| 10 | 28 | -4 | 24 | -40 | 11 | | | | |

$((-128) \times 0 + (-64) \times 4 + 64 \times 3 + 128 \times 3)/10 = 32$

FIG.6A

| CLOCK | Vin | B4 | B2 | B3 | Y[1:0] | NO. OF "00" | NO. OF "01" | NO. OF "11" | NO. OF "10" |
|---|---|---|---|---|---|---|---|---|---|
| 1 | -28 | 0 | -28 | 36 | 01 | 3 | 3 | 4 | 0 |
| 2 | -28 | 36 | 8 | -56 | 11 | | | | |
| 3 | -28 | -56 | -84 | 44 | 00 | | | | |
| 4 | -28 | 44 | 16 | -48 | 11 | | | | |
| 5 | -28 | -48 | -76 | 52 | 00 | | | | |
| 6 | -28 | 52 | 24 | -40 | 11 | | | | |
| 7 | -28 | -40 | -68 | 60 | 00 | | | | |
| 8 | -28 | 60 | 32 | -32 | 11 | | | | |
| 9 | -28 | -32 | -60 | 4 | 01 | | | | |
| 10 | -28 | 4 | -24 | 40 | 01 | | | | |

$((-128) \times 3 + (-64) \times 3 + 64 \times 4 + 128 \times 0)/10 = -32$

FIG.6B

| CLOCK | Vin | B4 | B2 | B3 | Y[1:0] | NO. OF "00" | NO. OF "01" | NO. OF "11" | NO. OF "10" |
|---|---|---|---|---|---|---|---|---|---|
| 1 | -100 | 0 | -100 | 28 | 00 | 6 | 4 | 0 | 0 |
| 2 | -100 | 28 | -72 | 56 | 00 | | | | |
| 3 | -100 | 56 | -44 | 20 | 01 | | | | |
| 4 | -100 | 20 | -80 | 48 | 00 | | | | |
| 5 | -100 | 48 | -52 | 12 | 01 | | | | |
| 6 | -100 | 12 | -88 | 40 | 00 | | | | |
| 7 | -100 | 40 | -60 | 4 | 01 | | | | |
| 8 | -100 | 4 | -96 | 32 | 00 | | | | |
| 9 | -100 | 32 | -68 | 60 | 00 | | | | |
| 10 | -100 | 60 | -40 | 24 | 01 | | | | |

$((-128) \times 6 + (-64) \times 4 + 64 \times 0 + 128 \times 0)/10 = -102.4$

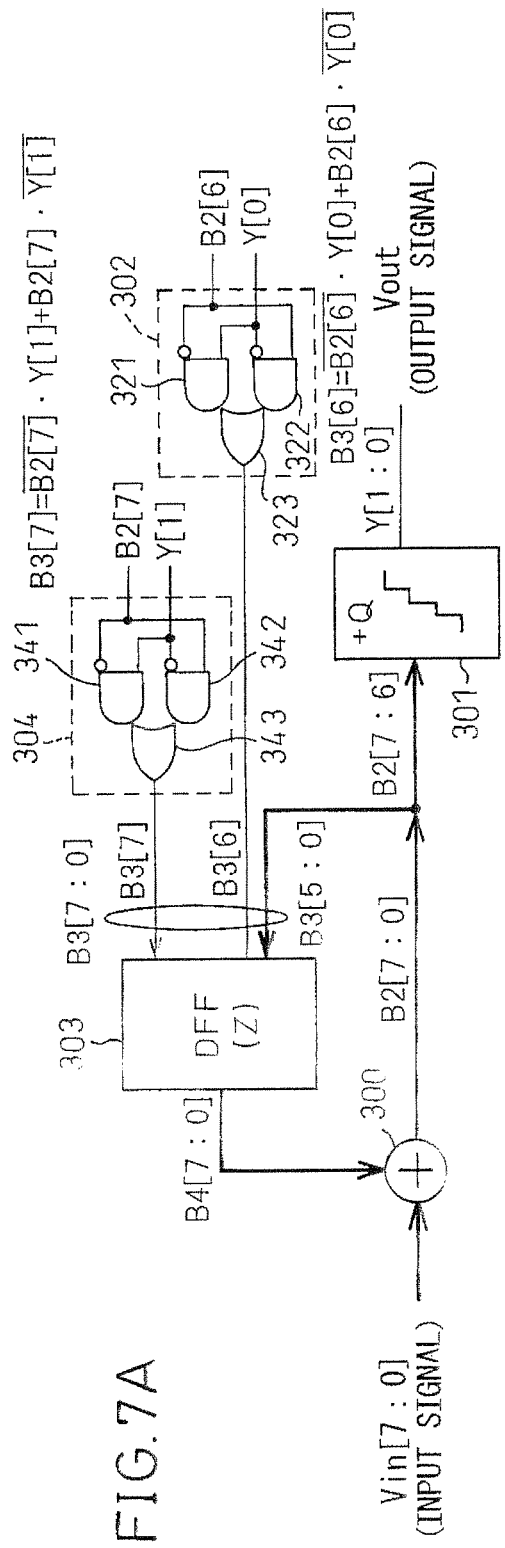

FIG.9A

| CLOCK | Vin | B4 | B2 | B3 | Y[1:0] | NO. OF "00" | NO. OF "01" | NO. OF "11" | NO. OF "10" |
|---|---|---|---|---|---|---|---|---|---|
| 1 | 100 | 0 | 100 | -28 | 10 | 0 | 0 | 4 | 6 |
| 2 | 100 | -28 | 72 | -56 | 10 | | (64×4+128×6)/10=102.4 | | |
| 3 | 100 | -56 | 44 | -20 | 11 | | | | |
| 4 | 100 | -20 | 80 | -48 | 10 | | | | |
| 5 | 100 | -48 | 52 | -12 | 11 | | | | |
| 6 | 100 | -12 | 88 | -40 | 10 | | | | |
| 7 | 100 | -40 | 60 | -4 | 11 | | | | |
| 8 | 100 | -4 | 96 | -32 | 10 | | | | |
| 9 | 100 | -32 | 68 | -60 | 10 | | | | |
| 10 | 100 | -60 | 40 | -24 | 11 | | | | |

FIG.9B

| CLOCK | Vin | B4 | B2 | B3 | Y[1:0] | NO. OF "00" | NO. OF "01" | NO. OF "11" | NO. OF "10" |
|---|---|---|---|---|---|---|---|---|---|
| 1 | 28 | 0 | 28 | -36 | 11 | 5 | 0 | 5 | 0 |
| 2 | 28 | -36 | -8 | -8 | 00 | | (0×5+64×5)/10=32 | | |
| 3 | 28 | -8 | 20 | -44 | 11 | | | | |
| 4 | 28 | 44 | -16 | -16 | 00 | | | | |
| 5 | 28 | -16 | 12 | -52 | 11 | | | | |
| 6 | 28 | -52 | -24 | -24 | 00 | | | | |
| 7 | 28 | -24 | 4 | -60 | 11 | | | | |
| 8 | 28 | -60 | -32 | -32 | 00 | | | | |
| 9 | 28 | -32 | -4 | -4 | 00 | | | | |
| 10 | 28 | -4 | 24 | -40 | 11 | | | | |

FIG.11A

| CLOCK | Vin | B4 | B2 | B3 | Y[1:0] |
|---|---|---|---|---|---|
| 1 | 100 | 0 | 100 | -28 | 10 |
| 2 | 100 | -28 | 72 | -56 | 10 |
| 3 | 100 | -56 | 44 | -20 | 11 |
| 4 | 100 | -20 | 80 | -48 | 10 |
| 5 | 100 | -48 | 52 | -12 | 11 |
| 6 | 100 | -12 | 88 | -40 | 10 |
| 7 | 100 | -40 | 60 | -4 | 11 |
| 8 | 100 | -4 | 96 | -32 | 10 |
| 9 | 100 | -32 | 68 | -60 | 10 |
| 10 | 100 | -60 | 40 | -24 | 11 |

| NO. OF "00" | NO. OF "01" | NO. OF "11" | NO. OF "10" |
|---|---|---|---|
| 0 | 0 | 4 | 6 |

$(64 \times 4 + 128 \times 6)/10 = 102.4$

FIG.11B

| CLOCK | Vin | B4 | B2 | B3 | Y[1:0] |
|---|---|---|---|---|---|
| 1 | 28 | 0 | 28 | -36 | 11 |
| 2 | 28 | -36 | -8 | -8 | 00 |
| 3 | 28 | -8 | 20 | -44 | 11 |
| 4 | 28 | -44 | -16 | -16 | 00 |
| 5 | 28 | 16 | 12 | -52 | 11 |
| 6 | 28 | -52 | -24 | -24 | 00 |
| 7 | 28 | -24 | 4 | -60 | 11 |
| 8 | 28 | -60 | -32 | -32 | 00 |
| 9 | 28 | -32 | -4 | -4 | 00 |
| 10 | 28 | -4 | 24 | -40 | 11 |

| NO. OF "00" | NO. OF "01" | NO. OF "11" | NO. OF "10" |
|---|---|---|---|
| 5 | 0 | 5 | 0 |

$(0 \times 5 + 64 \times 5)/10 = 32$

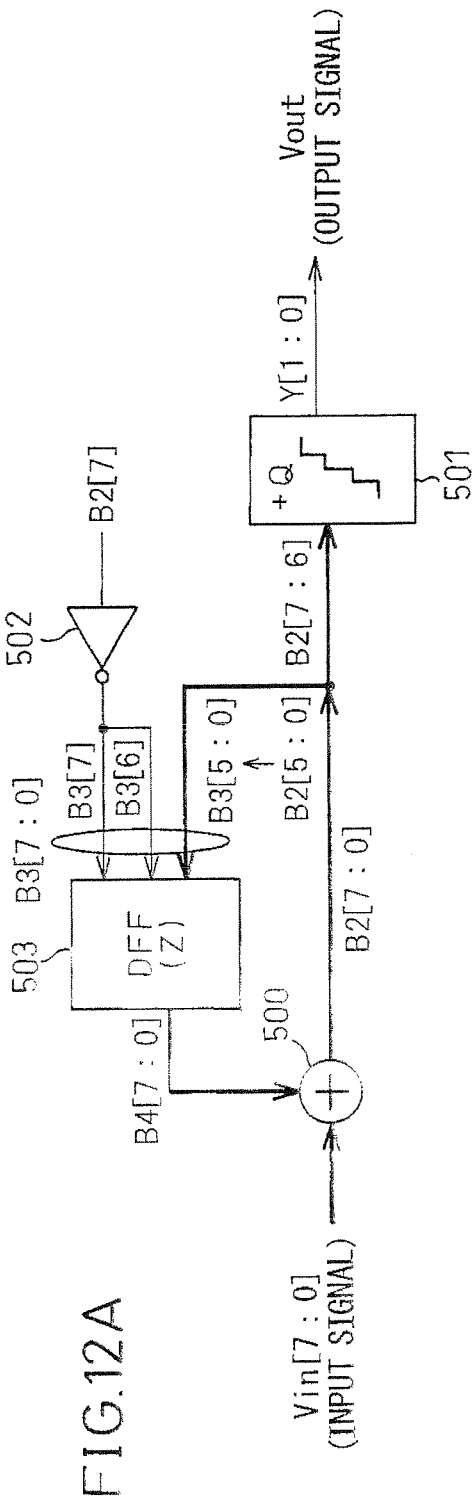

FIG.13A

| CLOCK | Vin | B4 | B2 | B3 | Y[1:0] | NO. OF "00" | NO. OF "01" | NO. OF "11" | NO. OF "10" |
|---|---|---|---|---|---|---|---|---|---|
| 1 | 100 | 0 | 100 | -28 | 10 | 0 | 0 | 4 | 6 |
| 2 | 100 | -28 | 72 | -56 | 10 | | | | |
| 3 | 100 | -56 | 44 | -20 | 11 | | | | |
| 4 | 100 | -20 | 80 | -48 | 10 | | | | |
| 5 | 100 | -48 | 52 | -12 | 11 | | | | |
| 6 | 100 | -12 | 88 | -40 | 11 | | | | |
| 7 | 100 | -40 | 60 | -4 | 11 | | | | |
| 8 | 100 | -4 | 96 | -32 | 10 | | | | |
| 9 | 100 | -32 | 68 | -60 | 10 | | | | |
| 10 | 100 | -60 | 40 | -24 | 11 | | | | |

Vout=102.4

FIG.13B

| CLOCK | Vin | B4 | B2 | B3 | Y[1:0] | NO. OF "00" | NO. OF "01" | NO. OF "11" | NO. OF "10" |
|---|---|---|---|---|---|---|---|---|---|
| 1 | 28 | 0 | 28 | -36 | 11 | 0 | 4 | 3 | 3 |
| 2 | 28 | -36 | -8 | 56 | 01 | | | | |
| 3 | 28 | 56 | 84 | -44 | 10 | | | | |
| 4 | 28 | -44 | -16 | 48 | 01 | | | | |
| 5 | 28 | 48 | 76 | -52 | 10 | | | | |
| 6 | 28 | 52 | -24 | 40 | 01 | | | | |
| 7 | 28 | 40 | 68 | -60 | 10 | | | | |
| 8 | 28 | 60 | -32 | 32 | 01 | | | | |
| 9 | 28 | 32 | 60 | -4 | 11 | | | | |
| 10 | 28 | -4 | 24 | -40 | 11 | | | | |

Vout=32

FIG.14A

| CLOCK | Vin | B4 | B2 | B3 | Y[1:0] | NO. OF "00" | NO. OF "01" | NO. OF "11" | NO. OF "10" |
|---|---|---|---|---|---|---|---|---|---|
| 1 | -28 | 0 | -28 | 36 | 01 | 3 | 3 | 4 | 0 |
| 2 | -28 | 36 | 8 | -56 | 11 | Vout=-32 | | | |
| 3 | -28 | -56 | -84 | 44 | 00 | | | | |
| 4 | -28 | 44 | 16 | -48 | 11 | | | | |
| 5 | -28 | -48 | -76 | 52 | 00 | | | | |
| 6 | -28 | 52 | 24 | -40 | 11 | | | | |
| 7 | -28 | -40 | -68 | 60 | 00 | | | | |
| 8 | -28 | 60 | 32 | -32 | 11 | | | | |
| 9 | -28 | -32 | -60 | 4 | 01 | | | | |
| 10 | -28 | 4 | -24 | 40 | 01 | | | | |

FIG.14B

| CLOCK | Vin | B4 | B2 | B3 | Y[1:0] | NO. OF "00" | NO. OF "01" | NO. OF "11" | NO. OF "10" |
|---|---|---|---|---|---|---|---|---|---|
| 1 | -100 | 0 | -100 | 28 | 00 | 6 | 4 | 0 | 0 |
| 2 | -100 | 28 | -72 | 56 | 00 | Vout=-102.4 | | | |
| 3 | -100 | 56 | -44 | 20 | 01 | | | | |
| 4 | -100 | 20 | -80 | 48 | 00 | | | | |
| 5 | -100 | 48 | -52 | 12 | 01 | | | | |
| 6 | -100 | 12 | -88 | 40 | 00 | | | | |
| 7 | -100 | 40 | -60 | 4 | 01 | | | | |
| 8 | -100 | 4 | -96 | 32 | 00 | | | | |
| 9 | -100 | 32 | -68 | 60 | 00 | | | | |
| 10 | -100 | 60 | -40 | 24 | 01 | | | | |

FIG.15B

CASE WHERE N=7, M=3

| B2[7:0] | B3-B2 | Y[2:0] |
|---|---|---|
| −97~−128 | +128 | 000 |
| −65~−96 | +96 | 001 |
| −33~−64 | +64 | 010 |
| −1~−32 | +32 | 011 |
| 0~31 | −32 | 111 |
| 32~63 | −64 | 110 |
| 64~95 | −96 | 101 |
| 96~127 | −128 | 100 |

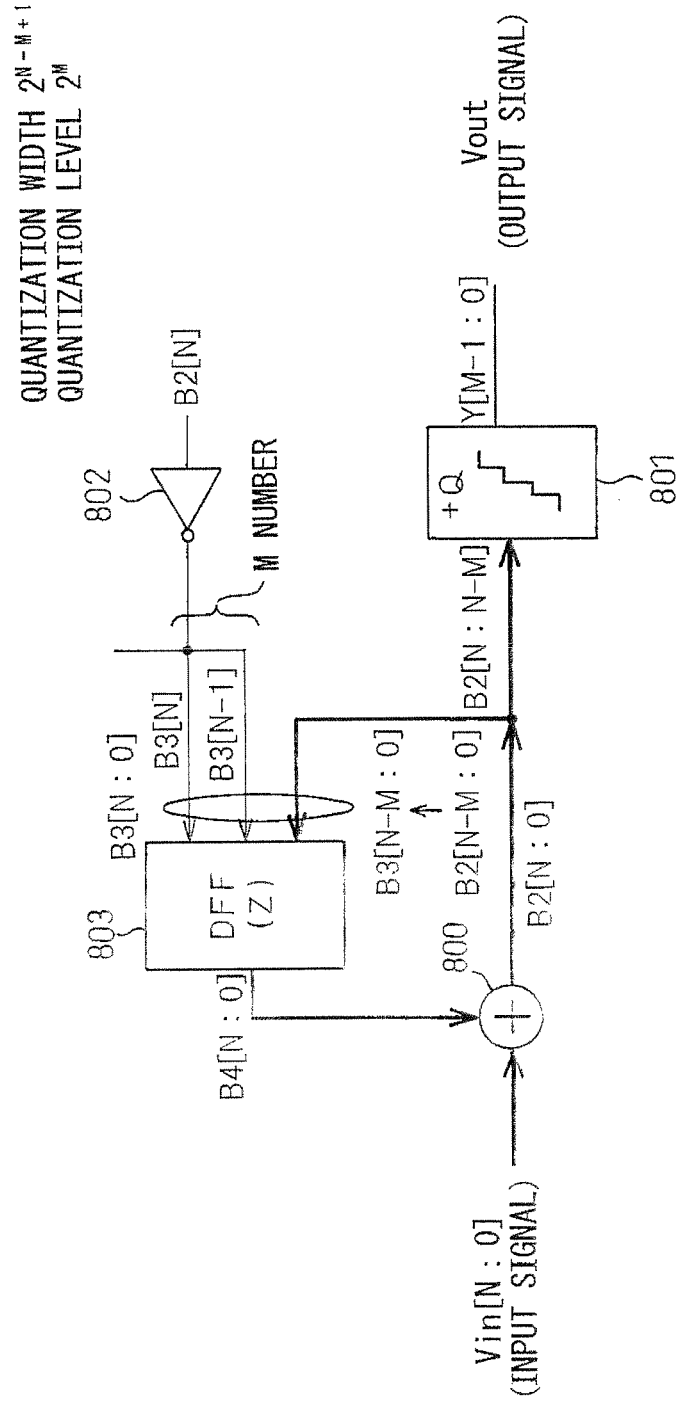

DATA MODULATION CIRCUIT

CROSS REFERENCE TO RELATED APPLICATION

This application is based upon and claims the benefit of priority of the prior Japanese Patent Application No. 2008-128164, filed on May 15, 2008, the entire contents of which are incorporated herein by reference.

FIELD

The embodiments discussed herein are related to a data modulation circuit.

BACKGROUND

In the past, ΔΣ modulation circuits (data modulation circuits) have been utilized for audios, A/D converters, etc. and, for example, have been used for converting analog signals or PCM digital signals to 1-bit signals (trains).

FIG. 1A and FIG. 1B are views illustrating an example of a conventional data modulation circuit and indicate a data modulation circuit applying primary ΔΣ modulation to modulate data. Note that FIG. 1A is a block diagram of a conventional data modulation circuit, while FIG. 1B is a view for explaining the operation of a selector in a conventional data modulation circuit.

In FIG. 1A, reference numerals 100 and 101 indicates adders, 102 a quantizer (comparator), and 103 and 104 D-type flip-flops (DFF). Here, the input signal Vin is, for example, made a 7-bit digital signal (signal of 28 to 100 minus predetermined bands at the minimum and maximum sides).

As illustrated in FIG. 1A, the input signal is input to the adder 100 where it added with the output signal $AZ^{-1}[7:0]$ of the DFF 103. The output signal of the adder 100 is input to the adder (subtractor) 101 where the output signal $YZ^{-1}[8:0]$ of the DFF 104 input to the negative input of the adder 101 is subtracted (negative addition).

Here, the DFF's 103 and 104 output the signal $(Z^{-1})$ delayed by exactly one cycle of the clock signal from the input signal. Further, the signal Y[1:0] is the output signal Vout[1:0] of the output circuit part 102, while the signal A[7:0] is the output signal of the adder 101. Note that [8:0] indicates an 8-bit signal, [7:0] indicates a 7-bit signal, and [1:0] indicates a 1-bit signal.

The adder 100, for example, adds an input signal Vin[7:0] from 28 to 100 and the output of the DFF 103, that is, the signal $AZ^{-1}[7:0]$ has the processing signal A delayed by 1 clock. Further, the adder 101 subtracts from the output signal of the adder 100 the signal $BZ^{-1}[8:0]$ having the processing signal AB output by the DFF 104 delayed by 1 clock.

Further, the output circuit part 102 discriminates and quantizes the output signal A[7:0] of the adder 101 by a predetermined threshold value. That is, as illustrated in FIG. 1B, the output circuit part 102, for example, outputs Y[1:0]=00 in the case where the input signal (output signal of the adder 101) A[7:0] is "less than 0" (A2[7:0]<0), outputs Y[1:0]=01 in the case where "0 to 63" (0≤B2[7:0]≤63), and outputs Y[1:0]=10 in the case where "64 to 128" (64≤B2[7:0]≤128).

The selector 105 receives as input the output signal Y[1:0] of the output circuit part 102 and outputs the signal B[8:0]. Further, the output signal B[8:0] of the selector 105 is made, for example, B[8:0]=0 in the case where Y[1:0]=00, is made B[8:0]=64 in the case where Y[1:0]=01, and is made B[8:0]=128 in the case where Y[1:0]=10 by the output signal Y[1:0] of the output circuit part 102. Further, the DFF 104 delays the signal B[8:0] by 1 clock and outputs the signal $BZ^{-1}[8:0]$.

FIG. 2A and FIG. 2B are views for explaining the operation of the data modulation circuit illustrated in FIG. 1A, where FIG. 2A illustrates the change in the time-series signals ($AZ^{-1}$, A, Y[1:0], $BZ^{-1}$, B) for the first to $10^{th}$ clocks 1 to 10 when inputting "100" to the input Vin, while FIG. 2B illustrates the change in the time-series signals for the first to $10^{th}$ clocks 1 to 10 when inputting "28" to the input Vin.

Here, if the input signal Vin is X and the quantized error of the output circuit part 102 is Q, the result becomes:

$$A = AZ^{-1} - YZ^{-1} + X \quad (1)$$

$$Y = A + Q \quad (2)$$

If entering formula (2) into formula (1):

$$Y - Q = (Y-Q)Z^{-1} - YZ^{-1} + X$$

Therefore, the following is obtained $$Y = X + (1 - Z^{-1})Q \quad (3)$$

Note that Y[1:0]=00 indicates that the signal A is "0", Y[1:0]=01 indicates that the signal A is "64", and Y[1:0]=10 indicates that the signal A is "128".

In the case of the ΔΣ demodulator, if dividing the sum of the number of the Y[1:0]=01 of a certain time×64 and the number of Y[1:0]=10×128 by the number of clocks, it is possible to demodulate the input signal.

Specifically, for example, in the case of FIG. 2A, it is learned that there are six Y[1:0]=10 and four Y[1:0]=01 in 10 clocks, so (128×6+64×4)/10=102.4 and the input signal 100 can be expressed by a 1-bit signal.

Further, for example, in the case of FIG. 2B, it is learned that there are five Y[1:0]=01 and five Y[1:0]=00 in 10 clocks, so (64×5+0×5)/10=32 and the input signal 28 can be expressed by a 1-bit signal.

Note that these values can express values approximating "100" and "28" as the number of clocks becomes greater.

In this regard, in the past, as a ΔΣ demodulator able to maintain a high conversion precision (linearity) by a low over sampling ratio and reduce the number of analog devices, there is proposed one providing a digital ΔΣ demodulator at the back end of an analog ΔΣ demodulator and feeding back a signal obtained by delaying 1-bit output of the digital ΔΣ demodulator to the front-end analog ΔΣ demodulator (see, for example, Japanese Laid-open Patent Publication No. 2001-094429).

Furthermore, in the past, there is also proposed a high speed over sample modulation circuit simplifying the quantizer so as to slash the number of bits of the processing circuit and realize multibit signal processing and high speed processing without increasing the circuit size (see, for example, Japanese Laid-open Patent Publication No. 2004-147074).

This high speed over sample modulation circuit includes an adder for adding an input signal of a plurality of bits and a first feedback signal, and a subtractor subtracting a second feedback signal from a first signal of a predetermined number of bits at the higher side in the output signal from the adder.

Further, the high speed over sample modulation circuit includes a first delay device, a quantizer and a second delay device. The first delay device delays a first signal having a second signal comprised of the remaining bits at the lower side of the output signal of the adder as its lower bits and having the output signal of the subtractor as its higher bits to output a first feedback signal.

The quantizer receives a third signal as input for quantization processing and outputting a quantization signal of a predetermined number of bits, and the second delay device delays the quantization signal to output a second feedback signal.

The quantizer is designed to select specific bits in the third signal to output the quantization signal.

The conventional data modulation circuit explained with reference to FIG. 1A, FIG. 1B, FIG. 2A, and FIG. 2B has to perform processing through the adders 100 and 101 and the output circuit part 102 from when the input signal Vin[7:0] (X) is input to when the output signal Vout[1:0](Y[1:0]) is output. As systems become higher in speed and greater in number of bits, it becomes difficult for these processings to be completed within 1 clock.

SUMMARY

According to an aspect of the embodiments, a data modulation circuit has an adder adding an input signal, and an output signal of a memory device; and an output circuit part discriminating and quantizing the output signal of the adder by a predetermined threshold value.

The memory device receives and holds the output signal of the adder and a predetermined signal, and supplies the held signals to the adder as an output signal of the memory device.

Additional objects and advantages of the embodiments will be set forth in part in the description which follows, and in part will be obvious from the description, or may be learned by practice of the embodiment. The object and advantages of the embodiments will be realized and attained by means of the elements and combinations particularly pointed out in the appended claims.

It is to be understood that both the foregoing general description and the following detailed description are exemplary and explanatory only and are not restrictive of the embodiments, as claimed.

BRIEF DESCRIPTION OF DRAWINGS

FIG. 2A and FIG. 2B are views for explaining the operation of the data modulation circuit illustrated in FIG. 1A;

FIG. 5A and FIG. 5B are first parts of a view for explaining the operation of the data modulation circuit illustrated in FIG. 3A;

FIG. 6A and FIG. 6B are second parts of a view for explaining the operation of the data modulation circuit illustrated in FIG. 3A;

FIG. 7A and FIG. 7B are views for explaining a data modulation circuit of a second embodiment;

FIG. 9A and FIG. 9B are views for explaining the operation of the data modulation circuit illustrated in FIG. 7A;

FIG. 11A and FIG. 11B is a view for explaining the operation of the data modulation circuit illustrated in FIG. 10A;

FIG. 12A and FIG. 12B are views for explaining a fourth embodiment of the data modulation circuit, FIG. 13A and FIG. 13B are first parts of a view for explaining the operation of the data modulation circuit illustrated in FIG. 12A, FIG. 14A and FIG. 14B are second parts of a view for explaining the operation of the data modulation circuit illustrated in FIG. 12A, FIG. 15A FIG. 18 is a view for explaining a seventh embodiment of the data modulation circuit.

DESCRIPTION OF EMBODIMENTS

Preferred embodiments of the data modulation circuit will be described in detail below while referring to the attached figures.

Figures 3A, 3B:
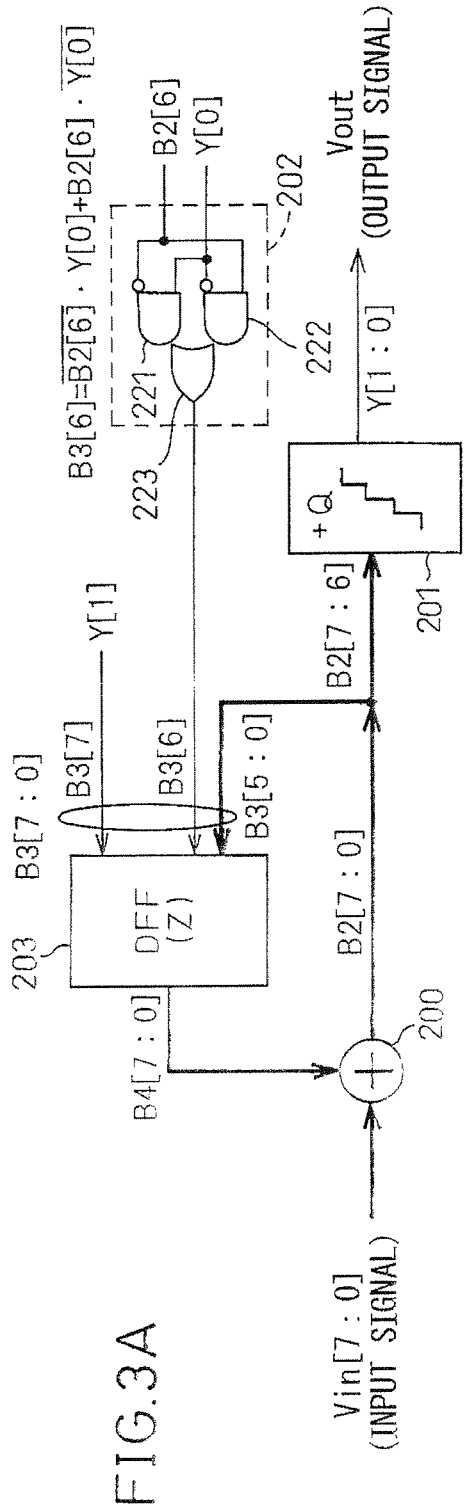
FIG. 3A and FIG. 3B are views for explaining a first embodiment of the data modulation circuit.

FIG. 3A and FIG. 3B are views for explaining a first embodiment of the data modulation circuit and indicate how a data modulation circuit applying primary $\Delta\Sigma$ modulation to modulate data.

Note that in the embodiments explained below, the explanation will be given with reference to an example of a data modulation circuit applying primary $\Delta\Sigma$ modulation, but the embodiments can of course also be applied to secondary or higher $\Delta\Sigma$ modulation as well of course.

Here, FIG. 3A is a block diagram of a data modulation circuit of a first embodiment, while FIG. 3B is a view for explaining the operation of a selector in the data modulation circuit of the first embodiment. In FIG. 3A, reference numeral 200 indicates an adder, 201 an output circuit part, 202 a logic circuit part, and 203 a D-type flip-flop (DFF). Note that the input signal Vin[7:0] is for example a digital signal of a range of −128 to 127, while Vin[7] is a sign bit.

Note that in the data modulation circuit of the first embodiment, the input signal Vin[7:0] is an integer in the range of −128 to 127. The quantization level is four levels.

As illustrated in FIG. 3A, the input signal Vin[7:0] is added by the adder 200 with the output signal B4[7:0] of the DFF 203 and outputs the signal B2[7:0] from the adder 200. Further, the output circuit part 201 discriminates and quantizes the output signal B2[7:6] of the adder 200 by a predetermined threshold value.

That is, as illustrated in FIG. 3B, the output circuit part 201, for example, for the input signal (output signal of the adder 200) B2[7:0], outputs Y[1:0]=00 in the case where −128≤B2[7:0]≤−65, outputs Y[1:0]=01 in the case where −64≤B2[7:0]≤−1, output Y[1:0]=11 in the case where 0≤B2[7:0]≤63, and outputs Y[1:0]=10 in the case where 64≤B2[7:0]≤127.

In the 2-bit signal Y[1:0] output from the output circuit part 201, the higher bit Y[1] is input to the DFF 203, while the lower bit Y[0] is input to the logic circuit part 202.

The DFF 203 receives as input the 5-bit signal B3[5:0] from the adder 200, the output signal from the logic circuit part 202 becoming the 6-bit signal B3[6], and the output signal Y[1] of the output circuit part 201 becoming the 7th bit signal B3[7] and outputs the above-mentioned 7-bit signal B4[7:0] to the adder 200. Note that the signal B2[5:0] from the adder 200 becomes the B3[5:0] input to the DFF 203 as it is.

Further, the logic circuit part 202 receives as input the 6$^{th}$ bit signal B2[6] from the adder 200 and the signal Y[0] from the output circuit part 201 and outputs the above-mentioned signal B3[6] to the DFF 203.

Note that logic circuit part 202 is for example comprised of two AND gates 221, 222 with one input made an inverted input and an OR gate 223. The output signal B3[6] is obtained by the next formula (4):

$$B3[6]=/B2[6]\cdot Y[0]+B2[6]\cdot /Y[0] \quad (4)$$

Figure 4:
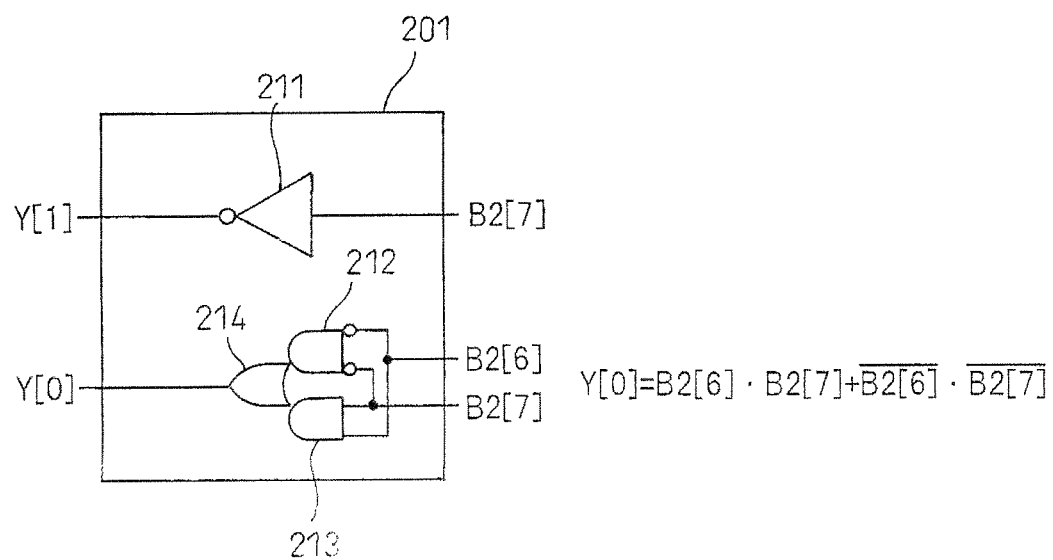
FIG. 4 is a circuit diagram illustrating an example of an output circuit part in the data modulation circuit illustrated in FIG. 3A.

FIG. 4 is a circuit diagram illustrating an example of the output circuit part in the data modulation circuit illustrated in FIG. 3A.

As illustrated in FIG. 4, the output circuit part 201 in the data modulation circuit of the first embodiment is provided with an inverter 211, an AND gate 212 with both inputs made inverted inputs, an AND gate 213, and a NOR gate 214, receives the higher two bits B2[7] and B2[6] in the output B2[7:0] of the adder 200, and outputs the signal Y[1] inverted from B2[7] and the signal Y[0] obtained by the next formula (5):

$$Y[0]=B2[6]\cdot B2[7]+/B2[6]\cdot /B2[7] \quad (5)$$

Figures 1A, 1B:
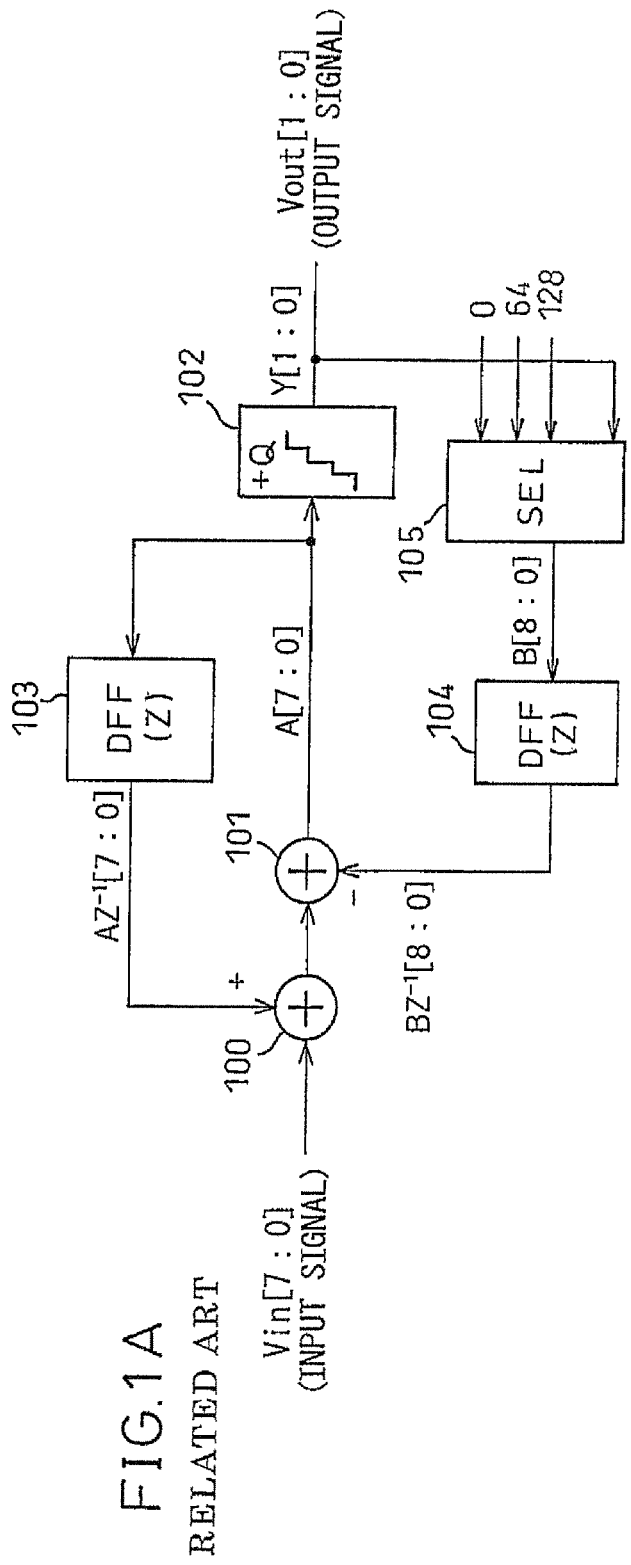
FIG. 1A and FIG. 1B are views for explaining an example of a conventional data modulation circuit.

Further, in the first embodiment, the DFF 203 delays the input signal B3[7:0] by 1 clock's worth of time and supplies the signal B4[7:0] to the adder 200 and thereby can realize high speed operation without causing a large increase in the circuit compared with the conventional data modulation circuit illustrated in FIG. 1A.

FIG. 5A, FIG. 5B, FIG. 6A, and FIG. 6B are views for explaining the operation of the data modulation circuit illustrated in FIG. 3A.

FIG. 5A illustrates the changes in the time-series signals (B4, B2, B3, Y[1:0]) for the first to 10$^{th}$ clocks 1 to 10 when inputting "100" to the input signal Vin, while FIG. 5B illustrates the changes in the time-series signals for the first to 10$^{th}$ clocks 1 to 10 when inputting "28" to the input signal Vin.

Furthermore, FIG. 6A illustrates the change of the time-series signals for the first to 10$^{th}$ clocks 1 to 10 when "–28" is input to the input Vin, while FIG. 6B illustrates the change of the time-series signals for the first to 10$^{th}$ clocks 1 to 10 when "–100" is input to the input Vin. Note that in the figures, Vin, B4, B2, and B3 are expressed by decimal numbers, while Y[1:0] is expressed by a binary number.

As illustrated in the above-mentioned FIG. 3A, when Y[1:0]=00, B2 indicates –128, when Y[1:0]=01, B2 indicates –64, when Y[1:0]=11, B2 indicates 64, and when Y[1:0]=10, B2 indicates 128.

In the case of FIG. 5A, there are zero Y[1:0]=00, zero Y[1:0]=01, four Y[1:0]=11, and six Y[1:0]=10 in 10 clocks, the following calculation formula stands:

$$Vout=((-128)\times 0+(-64)\times 0+64\times 4+128\times 6)/10$$

and the figure of Vout=102.4 can be calculated.

That is, inherently, the output is 2 bits, so only a signal from 0 to 3 can be expressed, but by using a ΔΣ demodulator, a value approximating "100" is obtained.

Further, in the case of FIG. 5A, there are zero Y[1:0]=00, four Y[1:0]=01, three Y[1:0]=11, and three Y[1:0]=10 in 10 clocks, the following calculation formula stands:

$$Vout=((-128)\times 0+(-64)\times 4+64\times 3+128\times 3)/10$$

Vout=32, and a value approximating "28" is obtained.

Further, in the case of FIG. 6A, there are three Y[1:0]=00, three Y[1:0]=01, four Y[1:0]=11, and zero Y[1:0]=10 in 10 clocks, the following calculation formula stands:

$$Vout=((-128)\times 3+(-64)\times 3+64\times 4+128\times 0)/10$$

Vout=–32, and a value approximating "–28" is obtained.

Further, in the case of FIG. 6B, there are six Y[1:0]=00, four Y[1:0]=01, zero Y[1:0]=11, and zero Y[1:0]=10 in 10 clocks, the following calculation formula stands:

$$Vout=((-128)\times 6+(-64)\times 4+64\times 0+128\times 0)/10$$

Vout=–102.4, and a value approximating "–100" is obtained.

In this way, inherently the output is two bits, so only a signal from 0 to 3 can be expressed, but by using the ΔΣ demodulator, it is learned that it is possible to obtain values approximating "100", "128", "–28", and "100". Note that these values were calculated by 10 clocks, but the greater the number of clocks, the smaller the error.

FIG. 7A and FIG. 7B are views for explaining a second embodiment of the data modulation circuit. Here, FIG. 7A is block diagram of a data modulation circuit of a second embodiment, further FIG. 7B is a view for explaining the operation of the selector in the data modulation circuit of the second embodiment.

In FIG. 7A, reference numeral 300 indicates an adder, 301 an output circuit part, 302 a first logic circuit part, 303 a D-type flip-flop (DFF), and 304 a second logic circuit part. Note that the input signal Vin[7:0] is a digital signal of for example the range of positive integers (0 to 127).

As illustrated in FIG. 7A, the input signal Vin[7:0] is added by the adder 300 with the output signal B4[7:0] of the DFF 303, whereupon the adder 300 outputs the signal B2[7:0]. Further, the output circuit part 301 discriminates and quantizes the output signal B2[7:6] of the adder 300 by a predetermined threshold value.

That is, as illustrated in FIG. 7B, the output circuit part 301, for example, for the input signal (output signal of the adder 300) B2[7:0], outputs Y[1:0]=00 in the case where B2[7:0]≤0, outputs Y[1:0]=11 in the case where 0<B2[7:0]≤63, and outputs Y[1:0]=10 in the case where 64≤B2[7:0]≤127.

In the 2-bit signal Y[1:0] output from the output circuit part 301, the higher bit Y[1] is input to the second logic circuit part 304, while the lower bit Y[0] is input to the first logic circuit part 302.

The DFF 303 receives as input the 5-bit signal B3[5:0] from the adder 300, the output signal of the first logic circuit part 302 becoming the 6th bit signal B3[6], and the output signal of the second logic circuit part 304 becoming the 7th bit signal B3[7] and outputs the above-mentioned 7-bit signal B4[7:0] to the adder 300. Note that the signal B2[5:0] from the adder 300 becomes the B3[5:0] input to the DFF 303 as it is.

Further, the first logic circuit part 302 receives as input the 6$^{th}$ bit signal B2[6] from the adder 300 and the signal Y[0] from the output circuit part 301 and outputs the above-mentioned signal B3[6] to the DFF 303. Note that the first logic circuit part 302, like the logic circuit part 202 of the above-mentioned first embodiment, for example is comprised of two AND gates 321 and 322 with one input made an inverted input and an OR gate 323. The output signal B3[6] is obtained by the above-mentioned formula (4).

Further, the second logic circuit part 304 receives as input the 7$^{th}$ bit signal B2[7] from the adder 300 and the signal Y[1] from the output circuit part 301 and outputs the above-mentioned signal B3[7] to the DFF 303. Note that the second logic circuit part 304 is, for example, comprised of two AND gates 341 and 342 with one input made an inverted input and an OR gate 343. The output signal B3[7] is obtained by the next formula (6):

$$B3[7]=/B2[7]\cdot Y[1]+B2[7]\cdot /Y[1] \quad (6)$$

Figure 8:
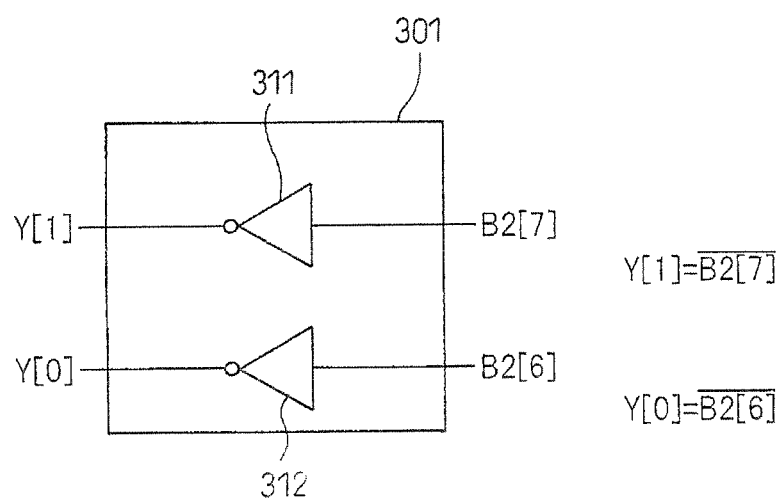
FIG. 8 is a circuit diagram illustrating an example of an output circuit part in the data modulation circuit illustrated in FIG. 7A.

FIG. 8 is a circuit diagram illustrating an example of the output circuit part in the data modulation circuit illustrated in FIG. 7A.

As illustrated in FIG. 8, the output circuit part 301 in the second embodiment is comprised of two inverters 311 and 312, while the output signals Y[0] and Y[1] become signals inverted in logic from the input signals B2[6] and B2[7].

That is, since the input signal Vin[7:0] is a digital signal of the range of positive integers (0 to 127), when the quantization level is 64, the output circuit part 301 becomes a simple circuit making the signals of the higher bits B2[7] and B2[6] inverted (outputting "1", when the input becomes "0" and outputting "0" when the input becomes "1") Y[1] and Y[0] thereby enabling much faster speed.

FIG. 9A and FIG. 9B are views for explaining the operation of the data modulation circuit illustrated in FIG. 7A, where FIG. 9A illustrates the changes in the time-series signals (B4, B2, B3, Y[1:0]) for the first to $10^{th}$ clocks 1 to 10 when inputting "100" to the input signal Vin, while FIG. 9B illustrates the changes in the time-series signals for the first to $10^{th}$ clocks 1 to 10 when inputting "28" to the input signal Vin. Note that in the figures, Vin, B4, B2, and B3 are expressed by decimal numbers, while Y[1:0] is expressed by a binary number.

In the case of FIG. 9A, there are zero Y[1:0]=00, zero Y[1:0]=01, four Y[1:0]=11, and six Y[1:0]=10 in 10 clocks, the following calculation formula stands:

$$Vout=(64\times4+128\times6)/10$$

and the figure of Vout=102.4 can be calculated.

Further, in the case of FIG. 9B, there are five Y[1:0]=00, zero Y[1:0]=01, five Y[1:0]=11, and zero Y[1:0]=10 in 10 clocks, the following calculation formula stands:

$$Vout=(0\times5+64\times5)/10$$

Vout=32, and a value approximating "28" is obtained. Note that these values were calculated by 10 clocks, but the larger the number of clocks, the smaller the error of course.

Figures 10A, 10B:
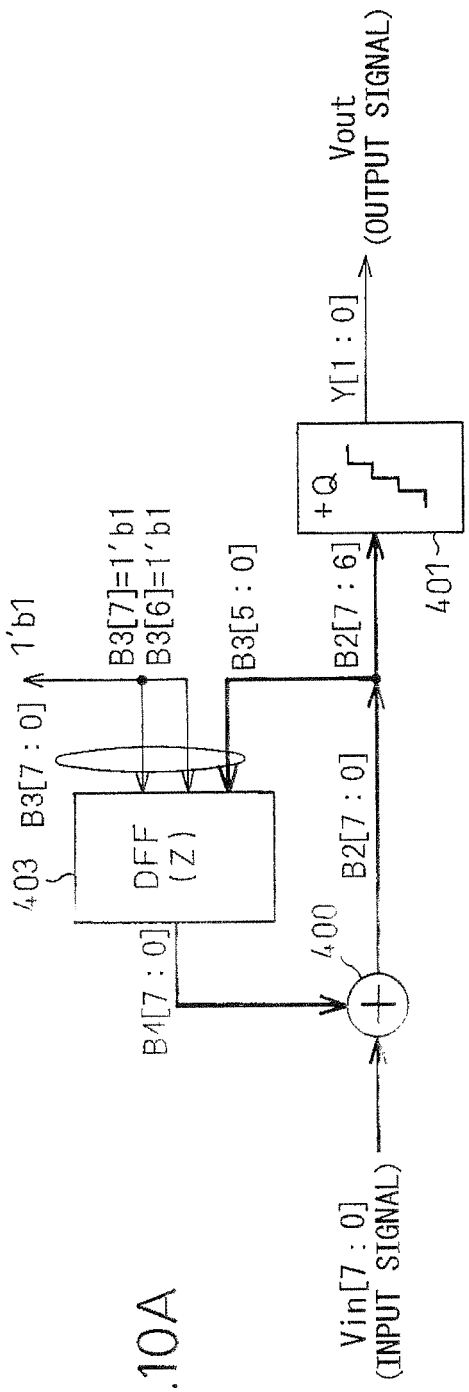
FIG. 10A and FIG. 10B are views for explaining a third embodiment of the data modulation circuit.

FIG. 10A and FIG. 10B are views for explaining a third embodiment of the data modulation circuit. Here, FIG. 10A is a block diagram of the data modulation circuit of the third embodiment, while FIG. 10B is a view for explaining the operation of the selector in the data modulation circuit of the third embodiment.

In FIG. 10A, reference numeral 400 indicates an adder, 401 indicates an output circuit part, and 403 indicates a DFF. Note that the data modulation circuit of the third embodiment indicates a circuit enabling even higher speed operation when the input signal Vin[7:0] is a digital signal of the range of positive integers (0 to 127) and the quantization level is 3.

As illustrated in FIG. 10A, in the data modulation circuit of the third embodiment, the signal Y[1:0] of the output circuit part 401 is not made the input of the DFF 403, while the input signal B3[7:0] of the DFF 403 is comprised of the signal B2[5:0] from the adder 400 and the signals B3[6] and B3[7] fixed to the high level "1". Note that the B3[7]=1'b1 in FIG. 10A indicates to set 1 bit of the most significant bit B3[7] input to the DFF 403 to the high level "1".

As illustrated in FIG. 10A, the input signal Vin[7:0] is added by the adder 400 with the DFF 403 output signal B4[7:0], whereby the adder 400 outputs the signal B2[7:0]. Further, the output circuit part 401 discriminates and quantizes the output signal B2[7:6] of the adder 400 by a predetermined threshold value.

That is, as illustrated in FIG. 10B, the output circuit part 401, for example, for the input signal (output signal of the adder 400) B2[7:0], outputs Y[1:0]=00 in the case where B2[7:0]<0, outputs Y[1:0]=11 in the case where 0≤B2[7:0]≤63, and outputs Y[1:0]=10 in the case where 64≤B2[7:0]≤127.

Note that the critical path of timing in the data modulation circuit of the third embodiment can be said to be suited to higher speeds since the delay of the adder 400 need only be completed within 1 clock.

FIG. 11A and FIG. 11B are views for explaining the operation of the data modulation circuit illustrated in FIG. 10A, where FIG. 11A illustrates the changes in the time-series signals (B4, B2, B3, Y[1:0]) for the first to $10^{th}$ clocks 1 to 10 when inputting "100" to the input signal Vin, while FIG. 11B illustrates the changes in the time-series signals for the first to $10^{th}$ clocks 1 to 10 when inputting "2" to the input signal Vin.

As illustrated in FIG. 11A, it is learned that when the input signal Vin is "100", there are four Y[1:0]=11 and six Y[1:0]=10 and when Vout=102.4, a value approximating "100" is obtained.

Further, as illustrated in FIG. 11B, it is learned that when the input signal Vin is "28", there are five Y[1.0]=00 and five Y[1:0]=11 and when Vout=32, a value approximating "28" is obtained.

FIG. 12A and FIG. 12B are views for explaining a fourth embodiment of the data modulation circuit. In the above third embodiment, an example of the case where the input signal Vin[7:0] was made a digital signal of the range of the integers (128 to 127) including also negative values. Here, FIG. 12A is a block diagram of the data modulation circuit of the fourth embodiment, while FIG. 12B is a view for explaining the operation of a selector in the data modulation circuit of the fourth embodiment.

In FIG. 12A, reference numeral 500 indicates an adder, 501 an output circuit part, 502 an inverter, and 503 a DFF.

As illustrated in FIG. 12A, even in the data modulation circuit of the fourth embodiment, the signal Y[1:0] from the output circuit part 501 is not made the input of the DFF 503, while the input signal B3[7:0] of the DFF 503 is comprised of the signal B2[5:0] from the adder 500 and the signals B3[6] and B3[7] obtained by inverting the signal B2[7] from the adder 500 by the inverter 502.

As illustrated in FIG. 12A, the input signal Vin[7:0] is added by the adder 500 with the output signal B4[7:0] of the DFF 503, whereupon the adder 500 outputs the signal B2[7:0]. Further, the output circuit part 501 discriminates and quantizes the output signal B2[7:6] of the adder 500 by a predetermined threshold value.

That is, as illustrated in FIG. 12B, the output circuit part 501, for example, for the input signal (output signal of the adder 500) B2[7:0], outputs Y[1:0]=00 in the case where −128≤B2[7:0]≤−65, outputs Y[1:0]=01 in the case where −64≤B2[7:0]≤−1, outputs Y[1:0]=11 in the case where 0≤B2[7:0]≤63, and outputs Y[1:0]=10 in the case where 64≤B2[7:0]≤127.

Note that the critical path of the timing in the data modulation circuit of the fourth embodiment becomes the sum of the delay of the adder 500 and the delay of the inverter 502, so compared with the prior art, faster speed operation becomes possible.

FIG. 13A, FIG. 13B, FIG. 14A, and FIG. 14B are views for explaining the operation of the data modulation circuit illustrated in FIG. 12A. Here, FIG. 13A, FIG. 13B, FIG. 14A, and FIG. 14B correspond to FIG. 5A, FIG. 5B, FIG. 6A, and FIG. 6B explaining the operation of the above-mentioned first embodiment.

That is, as illustrated in FIG. 13A, when inputting "100" to the input signal Vin, the output Vout becomes 102.4. Further, as illustrated in FIG. 13B, when inputting "28" to the input signal Vin, the output Vout becomes 32. Furthermore, as illustrated in FIG. 14A, when inputting "−28" to the input signal Vin, the output Vout becomes −32. Further, as illustrated in FIG. 14B, when inputting "−100" to the input signal Vin, the output Vout becomes −102.4.

In this way, according to the data modulation circuit of the fourth embodiment, it is learned that the output signal Vout approximating the input signal Vin can be output.

Figure 15A:
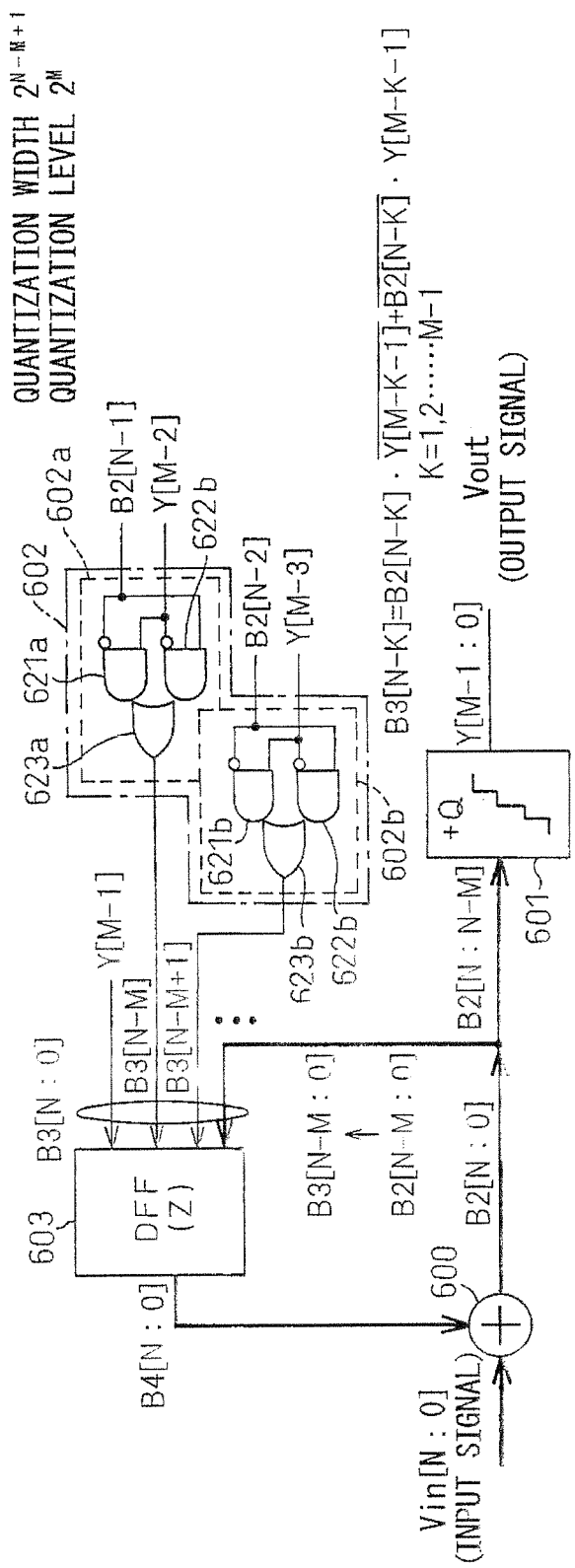
FIG. 15B is a view for explaining a fifth embodiment of the data modulation circuit.

FIG. 15A and FIG. 15B are views for explaining a fifth embodiment of the data modulation circuit. Here, FIG. 15A is a block diagram of a data modulation circuit of the fifth embodiment, while FIG. 15B is a view for explaining the operation of a selector in the data modulation circuit of the fifth embodiment. Note that the data modulation circuit of the fifth embodiment illustrated in FIG. 15A corresponds to a generalized type of the data modulation circuit of the first embodiment illustrated in FIG. 3A.

In FIG. 15A, reference numeral 600 indicates an adder, 601 an output circuit part, 602 a logic circuit part, and 603 a DFF. Note that the fifth embodiment indicates the case where N is made a natural number, the input signal Vin[N:0] is a digital signal of the range of (−$2^N$ to $2^N$−1), and the quantization level is $2^M$ (M is a natural number smaller than N). Note that FIG. 15B indicates when N=7 and M=3.

As illustrated in FIG. 15A, the input signal Vin[N:0] is added by the adder 600 with the output signal B4[N:0] of the DFF 603, whereupon the adder 600 outputs the signal B2[N:0].

The output circuit part 601 receives the signal B2[N:N−M] from the adder 600 and outputs the signal Y[M−1:0]. Here, in the signal Y[M−1:0] output from the output circuit part 601, the highest bit Y[M−1] is input to the DFF 603, while the bits Y[M−2] and Y[M−3] are input to the logic circuit part 602.

The DFF 603 receives as input the N−M bit signal B3[N−M:0] from the adder 600, the output signal from the logic circuit part 602 becoming the N−Mth bit signal B3[N−M] and N−M+1st bit signal B3[N−M+1], and the output signal Y[M−1] of the output circuit part 601 becoming the M−1st bit signal B3[M−1] and outputs the above-mentioned N-bit signal B4[N:0] to the adder 600. Note that the signal B2[N:N−M] from the adder 600 becomes the B3[N:N−M] input to the DFF 603 as it is.

As illustrated in FIG. 15A, the logic circuit part 602 is provided with a first partial circuit 602a receiving as input the output signal B2[N−1] from the adder 600 and the signal Y[M−2] from the output circuit part 601 and outputting the above-mentioned signal B3[N−M] to the DFF 603 and a second partial circuit 602b receiving as input the output signal B2[N−2] from the adder 600 and the signal Y[M−3] from the output circuit part 601 and outputting the above-mentioned signal B3[N−M+1] to the DFF 603.

The first partial circuit 602a and second partial circuit 602b are for example comprised of two AND gates 621a, 622a; 621b, 622b with one input made inverted inputs and OR gates 623a; 623b.

FIG. 15B indicates the case where N=7 and M=3. At this time, the output circuit part 601, for the signal B2[7:0], outputs Y[1:0]=000 in the case where −128≤B2[7:0]≤−97, outputs Y[1:0]=001 in the case where −96≤B2[7:0]≤−65, outputs Y[1:0]=010 in the case where −64≤B2[7:0]≤−33, and outputs Y[1:0]=011 in the case where −32≤B2[7:0]≤−1.

Further, the output circuit part 601, for the signal B2[7:0], outputs Y[1:0]=111 in the case where 0≤B2[7:0]≤31, outputs Y[1:0]=110 in the case where 32≤B2[7:0]≤63, outputs Y[1:0]=101 in the case where 64≤B2[7:0]≤95, and outputs Y[1:0]=100 in the case where 96≤B2[7:0]≤127.

Figure 16:
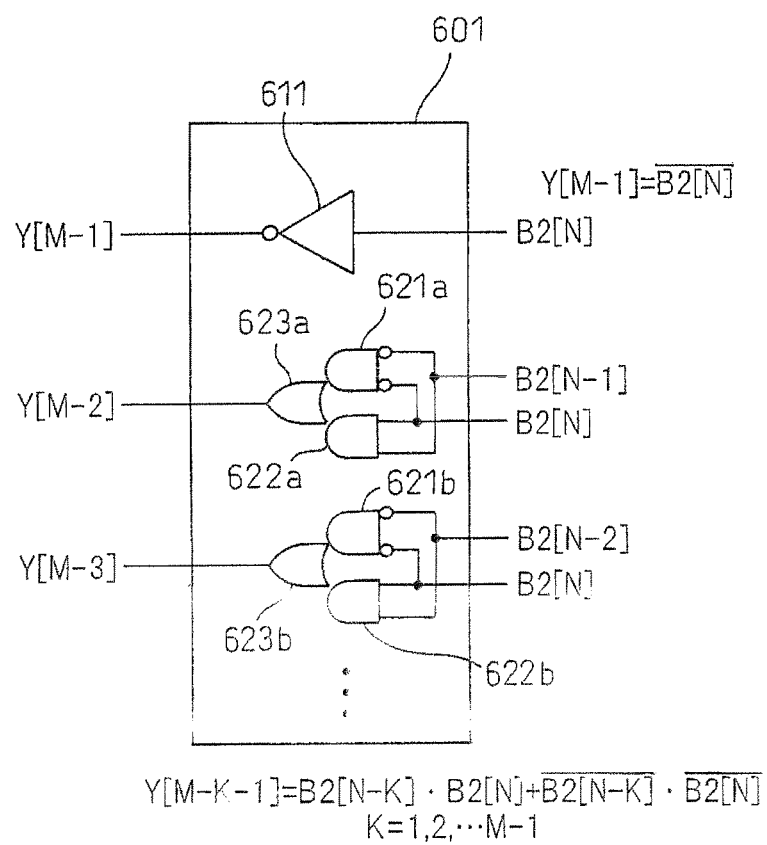
FIG. 16 is a circuit diagram illustrating an example of an output circuit part in the data modulation circuit illustrated in FIG. 15A.

FIG. 16 is a circuit diagram illustrating an example of an output circuit part in the data modulation circuit illustrated in FIG. 15A and indicates an example of the configuration of the output circuit 601 when the input signal Vin illustrated in FIG. 15A is in the range of [N:0] (−$2^N$ to $2^N$−1) and the quantization level is $2^M$.

As illustrated in FIG. 16, the output circuit 601 is provided with a partial circuit comprised of an inverter 611 for generating a signal Y[M−1], a plurality of sets of AND gates 621a, 621b with both inputs made inverted inputs . . . , AND gates 622a, 622b, . . . and NOR gates 623a, 623b . . . for generating the signals Y[M−2], Y[M−3], . . . and generates an output signal [M−1:0].

Note that if making K=1, 2, 3, . . . , M−1, the signal Y[M−K−1] produced by the different sets of partial circuits (that is, Y[M−2], Y[M−3], . . . ) is obtained from the next formula (7):

$$Y[M-K-1]=B2[N-K]\cdot B2[N]+\overline{B2[N-K]}\cdot\overline{B2[N]} \qquad (7)$$

Therefore, when the input signal Vin is the range of [N:0] (−$2^N$ to $2^N$−1) and the quantization level is $2^M$, when B2[N] is positive (+), the output circuit 601 outputs the inversion of Y[M−1]=B2[N], the inversion of Y[M−2]=B2[N−1], and the inversion of Y[M−3]=B2[N−2].

Further, when B2[N] is negative (−), it outputs the inversion of Y[M−1]=B2[N], Y[M−2]=B2[N−1], and Y[M−3]=B2[N−2].

Figure 17:
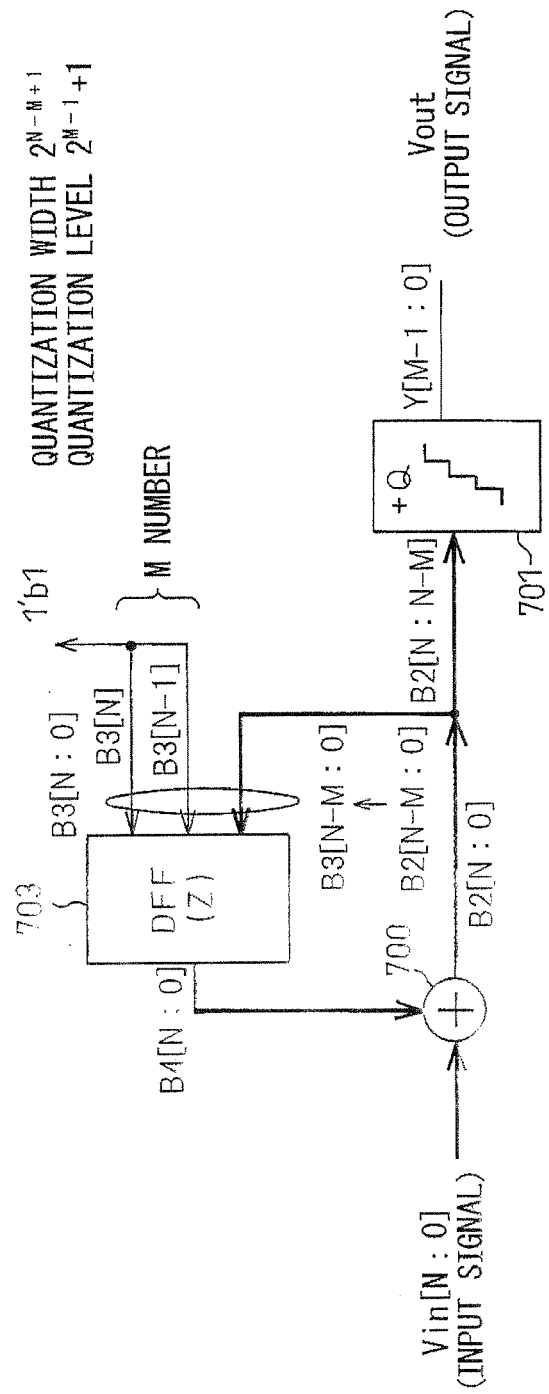
FIG. 17 is a view for explaining a sixth embodiment of the data modulation circuit.

FIG. 17 is a view for explaining a sixth embodiment of the data modulation circuit and indicates a block diagram of a data modulation circuit. Note that the data modulation circuit of this sixth embodiment illustrated in FIG. 17 corresponds to a generalized type of the data modulation circuit of the third embodiment illustrated in FIG. 10A.

In FIG. 17, reference numeral 700 indicates an adder, 701 an output circuit part, and 703 a DFF. Note that this sixth embodiment indicates the case where N is a natural number, the input signal Vin[N:0] is a digital signal of the range of (−$2^N$ to $2^N$−1), and the quantization level is $2^M$ (M is a natural number smaller than N).

As illustrated in FIG. 17, the input signal Vin[N:0] is added by the adder 700 with an output signal. B4[N:0] of the DFF 703, whereupon the adder 700 outputs the signal B2[N:0]. The output circuit part 701 receives the signal B2[N:N−M] from the adder 700 and outputs the signal Y[M−1:0].

The DFF 703 receives the N−M bit signal B3[N−M:0] from the adder 700 and the M-bit signal fixed at the high level "1" (1'b1) (that is, B3[N], B3[N−1], . . . , B3[N−M+1]) and outputs the above-mentioned signal B[N:0] to the adder 700.

That is, the data modulation circuit of this sixth embodiment, like the above-mentioned third embodiment, is suitable for increasing the speed since the signal Y[M:0] from the output circuit part 701 is not made the input of the DFF 703 and the delay of the adder 700 need only be completed within one clock.

FIG. 18 is a view for explaining a seventh embodiment of the data modulation circuit and indicates a block diagram of the data modulation circuit. Note that the data modulation circuit of the seventh embodiment illustrated in FIG. 18 corresponds to a generalized type of the data modulation circuit of the fourth embodiment illustrated in FIG. 12A.

In FIG. 18, reference numeral 800 indicates an adder, 801 an output circuit part, 802 an inverter, and 803 a DFF. Note that this seventh embodiment indicates the case where N is a natural number, the input signal Vin[N:0] is a digital signal of the range of (−$2^N$ to $2^N$−1), and the quantization level is $2^M$ (M is a natural number smaller than N).

As illustrated in FIG. 18, the input signal Vin[N:0] is added by the adder 800 with the output signal B4[N:0] of the DFF 803, whereupon the adder 800 outputs the signal B2[N:0].

The output circuit part 801 receives the signal B2[N:N−M] from the adder 800 and outputs the signal Y[M−1:0]. The inverter 802 receives the signal B2[N] from the adder 800 and outputs an M-bit signal (that is, B3[N], B3[N−1], . . . , B3[N−M+1]) inverted from that signal B2[N] to the DFF 803.

That is, the DFF 803 receives the N−M bit signal B3[N−M:0] from the adder 800 and the M-bit signal. B3[N:N−M+1] inverted from the signal B2[N] from the inverter 802 and outputs the above-mentioned signal B[N:0] to the adder 800.

In the data modulation circuit of the seventh embodiment, like the above-mentioned fourth embodiment, the critical path of the timing in the data modulation circuit becomes the sum of the delay of the adder 800 and the delay of the inverter 802, so compared with the prior art, a much faster speed operation becomes possible In this way, according to the embodiments, it is possible to provide a data modulation circuit able to operate at a high speed.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a illustrating of the superiority and inferiority of the invention.

Although the embodiments of the present invention have been described in detail, it should be understood that the various changes, substitutions, and alterations could be made hereto without departing from the spirit and scope of the invention.

What is claimed is:

1. A data modulation circuit, comprising:
a memory circuit configured to output a first output signal;
an adder configured to add a first input signal and the first output signal and to output a second output signal;
a logic circuit configured to receive and logically process the second output signal and to output a third output signal; and
an output circuit configured to discriminate and quantize the second output signal by a threshold value and to output a fourth output signal, wherein
the memory circuit is configured to receive and hold the second output signal second input signal, and configured to combine the held signals and to output the combined signals to the adder as the first output signal, the second input signal including the third output signal; and
the logic circuit is configured to receive and logically process the second output signal and the fourth output signal, and to output the second input signal to the memory circuit.

2. The data modulation circuit of claim 1, wherein the second input signal includes a signal fixed in level.

3. The data modulation circuit of claim 1, wherein the second input signal includes the fourth output signal.

4. The data modulation circuit of claim 1, wherein the data modulation circuit is a $\Delta\Sigma$ modulation circuit applying $\Delta\Sigma$ modulation to modulate data of the first input signal.

5. A data modulation circuit, comprising:
a memory circuit configured to output a first output signal;
an adder configured to add a first input signal and the first output signal and to output a second output signal;
a logic circuit configured to receive and logically process the second output signal and to output a third output signal; and
an output circuit configured to discriminate and quantize the second output signal by a threshold value and to output a fourth output signal, wherein
the memory circuit is configured to receive and hold the second output signal second input signal, and configured to combine the held signals and to output the combined signals to the adder as the first output signal, the second input signal including the third output signal;
the first input signal is an input digital signal of $-2^N$ to $2^N-1$, where N is a natural number; and
the fourth output signal is an M-bit output digital signal, where M is a natural number less than N and the level of quantization is a $2^M$ level.

6. The data modulation circuit of claim 5, wherein
the logic circuit is configured to receive and logically process a first output signal part of an upper bit side in the second output signal and the fourth output signal to produce the second input signal; and
the memory circuit is configured to receive a second output signal part of a lower bit side in the second output signal and the second input signal produced by the logic circuit.

7. A data modulation circuit, comprising:
a memory circuit configured to output a first output signal;
an adder configured to add a first input signal and the first output signal and to output a second output signal;
a logic circuit configured to receive and logically process the second output signal and to output a third output signal; and
an output circuit configured to discriminate and quantize the second output signal by a threshold value and to output a fourth output signal, wherein
the memory circuit is configured to receive and hold the second output signal second input signal, and configured to combine the held signals and to output the combined signals to the adder as the first output signal, the second input signal including the third output signal;
the first input signal is an input digital signal of 0 to $2^N-1$, where N is a natural number; and
the fourth output signal is an M-bit output digital signal, where M is a natural number less than N and the level of the quantization is a $2^{M-1}+1$ level.

8. The data modulation circuit of claim 7, wherein
the logic circuit is configured to receive and logically process a first output signal part of an upper bit side in the second output signal and the fourth output signal to produce the second input signal; and
the memory circuit is configured to receive a second output signal part of a lower bit side in the output signal and the second input signal produced by the logic circuit.

* * * * *